US006822862B2

(12) United States Patent
Rong-Yao

(10) Patent No.: US 6,822,862 B2
(45) Date of Patent: Nov. 23, 2004

(54) APPARATUS AND METHOD FOR HEAT SINK

(75) Inventor: Lee Rong-Yao, Taipei (TW)

(73) Assignee: Saint Song Corp. (TW)

( * ) Notice: Subject to any disclaimer, the term of this patent is extended or adjusted under 35 U.S.C. 154(b) by 74 days.

(21) Appl. No.: 10/294,623

(22) Filed: Nov. 15, 2002

(65) Prior Publication Data
US 2004/0095722 A1 May 20, 2004

(51) Int. Cl.$^7$ ................................................ H05K 7/20
(52) U.S. Cl. ...................... 361/695; 165/80.3; 165/121; 361/703; 257/722; 454/184
(58) Field of Search ................ 165/80.2, 80.3, 165/121, 126, 185; 62/259.2; 361/687, 694–695, 703, 697, 715; 257/722; 454/184

(56) References Cited

U.S. PATENT DOCUMENTS 6,438,984 B1 * 8/2002 Novotny et al. ........... 62/259.2
6,654,247 B1 * 11/2003 Lee ............................ 361/697

* cited by examiner

Primary Examiner—Gregory D. Thompson
(74) Attorney, Agent, or Firm—Arent Fox, PLLC

(57) ABSTRACT

A method for computer host heat dissipation, a heat-dissipating device being mounted on a CPU utilized for partially or wholly conducting heat generated by the CPU to the heat-dissipating device, a fan being mounted on a north bridge chipset utilized for partially or wholly dissipating heat generated by said north bridge chipset, the fan having an air outlet utilized for blowing air flow towards the heat-dissipating device in an air-blowing direction, characterized in that a channeling device is disposed at the periphery of both the fan and the heat-dissipating device; the channeling device is utilized for directing an air-channeling direction, with such air-channeling direction being substantially parallel to the air-blowing direction by the fan, and the air-blowing direction by the fan is in the air-channeling direction, and the heat-dissipating device is in the air-blowing direction.

9 Claims, 6 Drawing Sheets

US 6,822,862 B2

APPARATUS AND METHOD FOR HEAT SINK

BACKGROUND OF THE INVENTION

1. Field of the Invention

The present invention relates to a heat-dissipating method for a computer host and apparatus thereof, more particularly, a heat-dissipating method for computer hosts by utilizing air-channeling device to direct heat-dissipating flow, and a heat-dissipating apparatus for computer hosts.

2. Description of Related Arts

The speedy upgrading trend in computer industry causes computers to have more and more powerful computing capacity, so do the performing speed for computer hosts and chipsets; yet heat energy generated by computer hosts and chipsets also increases. Therefore, sinks for adding heat-dissipating areas are designed for corresponding to heat sources generating higher rate of heat quantity.

The conventional computer sinks mainly comprise aluminum extrusion, die casting and folding types, wherein the density (total heat-dissipating area per unit area) for both the aluminum extrusion and die casting types of computer sinks is confined, so the volume and weight thereof shall be increased in accordance with heat sources having higher and higher rate of heat generation. Whereas the folding type of computer sinks utilizes metal plates as fins to stack consecutively, thus creating higher density having better heat-dissipating efficiency with volume and weight thereof being acceptable to industries.

For enhancing the heat-dissipating efficiency of computer sinks, a fan is integrated thereto, through appropriate fixating structure, so as to assist in heat dissipation. As the fan is energized, cold air surrounding the fans is to be blown to sinks so as to assist in heat dissipation and thus form a heat-dissipating structure with better heat-dissipating efficiency.

FIG. 1 shows that the conventional heat-dissipating assembly structure comprises a sink 10a and a fan 20a, wherein the sink 10a, made of copper or aluminum, has a main body 11a whereon a plurality of fins 12a are formed, with the bottom surface of the main body 11a capable of jointing with the surface of the heat sources 30a such as CPU or chipset so as to assist in heat dissipation.

The fan 20a is mounted on the sink 10a by a screw 21a, thus when the fan 20a is energized, cold air on top can be caused to blow downwards to the sink 10a, so as to assist in heat dissipation.

However, the fan in a conventional heat-dissipating assembly structure is to blow downwards for heat-dissipating purpose, such design that generates larger wind pressure, thus heat energy cannot be swiftly dissipated. As a result, such convention heat-dissipating structure cannot achieve either the better heat-dissipating efficiency or more powerful heat-dissipating capacity.

Moreover, the conventional heat-dissipating assembly structure can only be utilized for a single heat source without being able to dissipate heat generated from more than one heat source. However, for a common computer host, CPU, north bridge chipset and other heat sources are to be installed therein. Consequently, provided the heat-dissipating structure can only dissipate heat against a single heat source, heat energy generated from other heat sources shall adversely affect the computer. If more than one heat-dissipating structures are disposed therein to respectively dissipate heat generated from each heat source, the production cost shall be increased with larger space being occupied.

Furthermore, since the fan Is mounted on the sink in the conventional heat-dissipating assembly structure, the overall height of the structure becomes greater, thus such heightened heat-dissipating assembly structure shall not be applicable to computer hosts having height limitations.

Also, since the greater portion of the high temperature dissipated by the conventional heat-dissipating assembly structure shall still stay in computer hosts, even though fans are utilized for blowing air towards CPU to dissipate heat, high-temperature air kept within computer hosts is to cause adverse affect on the heat-dissipating effect, and due to the fact that fans have to keep running, more electricity shall be wasted.

In addition, an apparatus with an air inlet is disclosed in R.O.C. Patent TW 490127, with an air outlet being disposed on the enclosed side, such that the air-channeling direction is to blow towards the heat-dissipating fin device. Yet such air outlet is not unidirectional, and the air-channeling device disclosed by the present invention is not disclosed by said prior art to improve on the heat-dissipating effect. On the other hand, the U.S. Pat. No. US2002/0071250 discloses a kind of parallel heat-dissipating plates with slant air-channeling directions, yet a plurality of air-channeling plates are disposed in the fan structure, such design is not identical to that in the present invention.

SUMMARY OF THE INVENTION

One object of the present invention is to provide with a heat-dissipating method for a computer host, wherein a heat-dissipating device is mounted on a CPU, such that heat generated by the CPU is partially or wholly conducted to the heat-dissipating device, and a fan is mounted on a north bridge chipset for carrying away heat generated by the north bridge chipset, with airflow generated by the fan being blown to the heat-dissipating device through an air-blowing outlet of the fan.

Another object of the present invention is to provide with a heat-dissipating apparatus comprising an air-blowing device to dissipate heat through blowing sideways, thus generating less wind pressure, such that heat energy can be swiftly dissipated, better heat-dissipating efficiency can be acquired, and greater heat-dissipating capacity can be performed.

Another object of the present invention is to provide with a heat-dissipating apparatus with separate design so as to dissipate heat against two heat sources simultaneously, thus acquiring better heat-dissipating effect, without increasing production cost and occupying greater space.

Another object of the present invention is to provide with a heat-dissipating apparatus having an air-blowing device thereof being disposed on the side of the heat-dissipating device, with a direction of the air-blowing device being identical or parallel to the heat-dissipating direction of the heat-dissipating device, thus the overall height of the whole heat-dissipating apparatus can be lowered, such design that makes the present invention applicable to computer hosts having height limitations, so as to fulfill the requirements for lighter, thinner and miniaturized computers.

Another object of the present invention is to provide with a computer heat-dissipating apparatus capable of dissipating high temperature generated by CPU kept in computer host out of computer host, so as to improve upon the drawback of ineffective heat-dissipating function for computer host, thus acquiring better heat-dissipating efficiency.

The present invention relates to a heat-dissipating method for computer host, whereby a heat-dissipating device is mounted on a CPU, such that heat energy generated by the CPU can be partially or wholly conducted to the heat-dissipating device; a fan is mounted on a north bridge chipset, such that heat energy generated by the north bridge chipset can be carried away, with airflow generated by the fan being blown to the heat-dissipating device through an air-blowing outlet of the fan, characterized in that a channeling device is disposed at the periphery of both the fan and the heat-dissipating device, the channeling device is utilized for directing an air-channeling direction, with such air-channeling direction being substantially parallel to the air-blowing direction by the fan, and the air-blowing direction by the fan is in the air-channeling direction, and the heat-dissipating device is in the air-blowing direction.

According to the present invention, the heat-dissipating device can be any type of conventional sinks utilized in computers, such as aluminum extrusion, die casting and folding types of fins, and such fins are preferably disposed in parallel.

According to the present invention, the fan can be any kind of conventional fans utilized in computers, preferably fans blowing sideways or more preferably fans blowing sideways with an air-blowing outlet. The single air-blowing outlet is either substantially identical or parallel to the fin grooves between parallel fins, preferably identical or parallel.

According to the present invention, the air-channeling device can be formed as any conventional ring-pole shape or ring-pole shape having one or more indentations substantially caused by peripheral surroundings, such as air-channeling device with n-type ring-pole shape or motherboard formed as n shape, preferably n shape and L shape.

One embodiment of the present invention, the heat-dissipating apparatus comprising:
   a heat-dissipating device utilized for direct or indirect contact with heat source;
   an air-blowing device utilized for blowing air out so as to assist in dissipating heat energy accumulated by said heat-dissipating device;
   characterized in that an air-channeling device is further included so as to substantially cover the periphery of said heat-dissipating device and said air-blowing device, utilized for directing air flow from said air-blowing device in an air-channeling direction, thus heat energy accumulated by said heat-dissipating device is dissipated.

According to the present invention, the heat-dissipating device and air-channeling device are as described previously.

According to the present invention, the air-blowing device can be any conventional fan such as air-conditioners, fans, etc, preferably fans. It is more preferable to utilize fans in accordance with heat-conducting plates, since heat energy generated by the north bridge chipset can be partially or wholly carried away thereby, with airflow generated by the fan being blown to the heat-dissipating device through an air-blowing outlet of the fan.

According to the present invention, the heat-dissipating device is as described previously.

Another embodiment of the present invention, the he heat-dissipating device of the present invention comprises:
   a heat-dissipating device having a plurality of parallel heat-dissipating fins utilized for direct or indirect contact with heat source;
   an air-blowing device utilized for blowing air out so as to assist in dissipating heat energy accumulated by said heat-dissipating device;
   characterized in that said heat-dissipating fin and said air-blowing device are formed separately, fins of said heat-dissipating fin being substantially parallel, said air-blowing device having a single air outlet with an air-blowing direction thereof substantially Identical or parallel to a direction formed by fin grooves between heat-dissipating fins of said heat-dissipating device.

The heat-dissipating fins and said air-blowing device are as described previously.

Another embodiment of the present invention, the he heat-dissipating apparatus comprises:
   a heat-dissipating device utilized for contacting a primary heat source directly or indirectly;
   an air-blowing device utilized for contacting a secondary heat source directly or indirectly and assisting in dissipating heat energy accumulated by said heat-dissipating device;
   characterized in that said air-blowing device has a single air outlet, said air-blowing device including a fan and a heat-conducting device, and said heat-conducting device having direct contact with said secondary heat source.

The heat-dissipating device and said air-blowing device are as described previously.

BRIEF DESCRIPTION OF THE DRAWINGS

These and other features, aspects and advantages of the present invention will become better understood with regard to the following description, appended claims and accompanying drawings that are provided only for further elaboration without limiting or restricting the present invention, where:

DETAILED DESCRIPTION OF THE PREFERRED EMBODIMENTS

The following is a detailed description of the best presently known modes of carrying out the inventions. This description is not to be taken in a limiting sense, but is made merely for the purpose of illustrating the general principles of the inventions.

Figure 1:
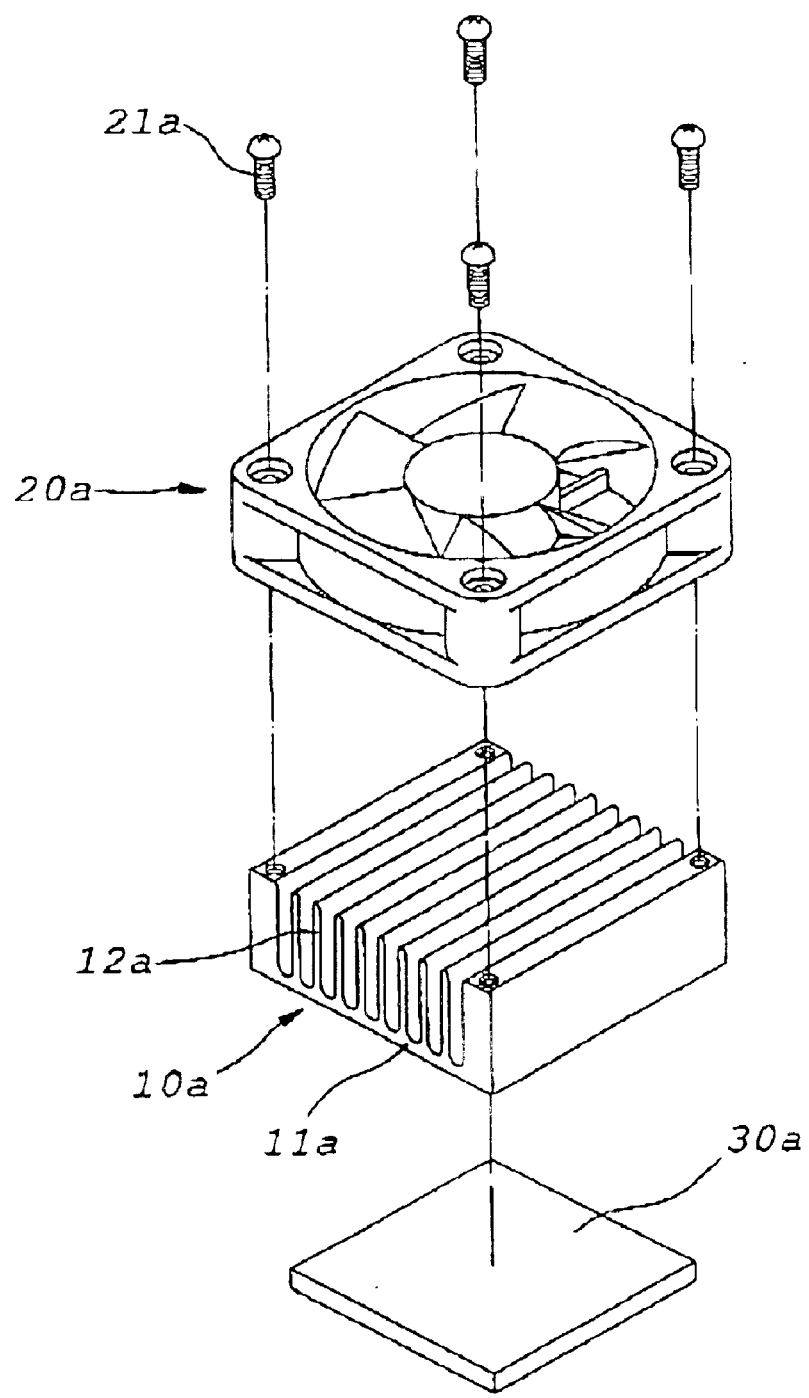
FIG. 1 shows a perspective sectional view of the conventional heat-dissipating structure.
Figure 2:
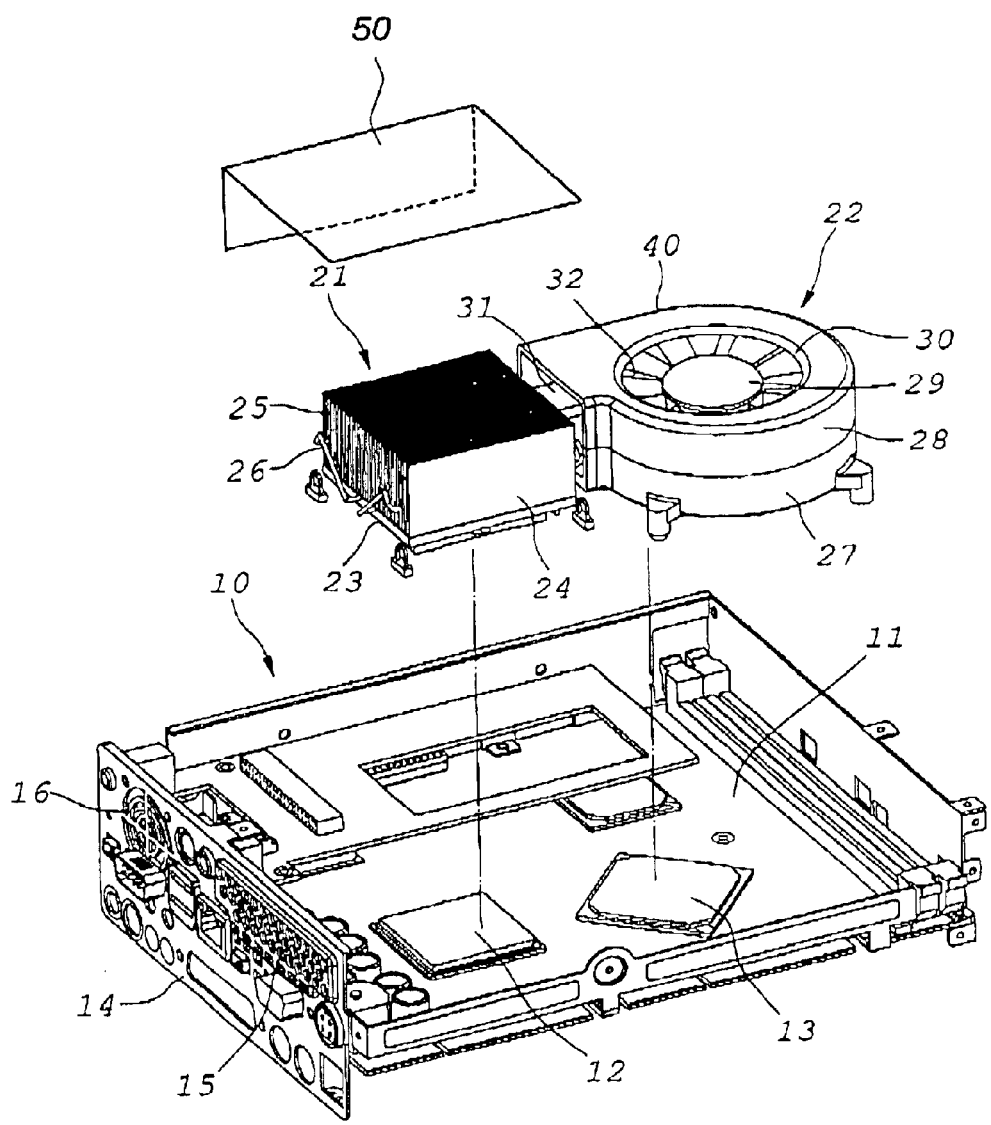
FIG. 2 shows a perspective sectional view of the present invention.
Figure 3:
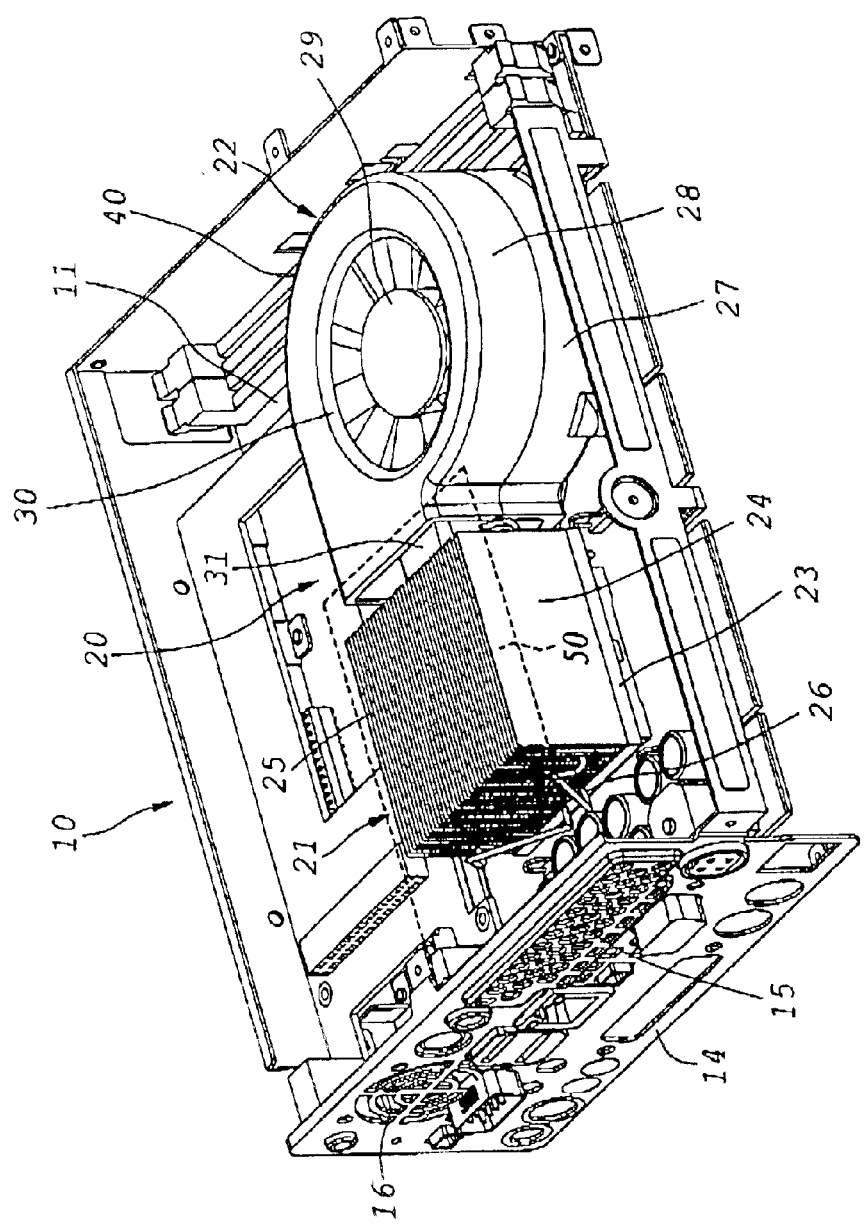
FIG. 3 shows a perspective assembly view of the present invention.
Figure 4:
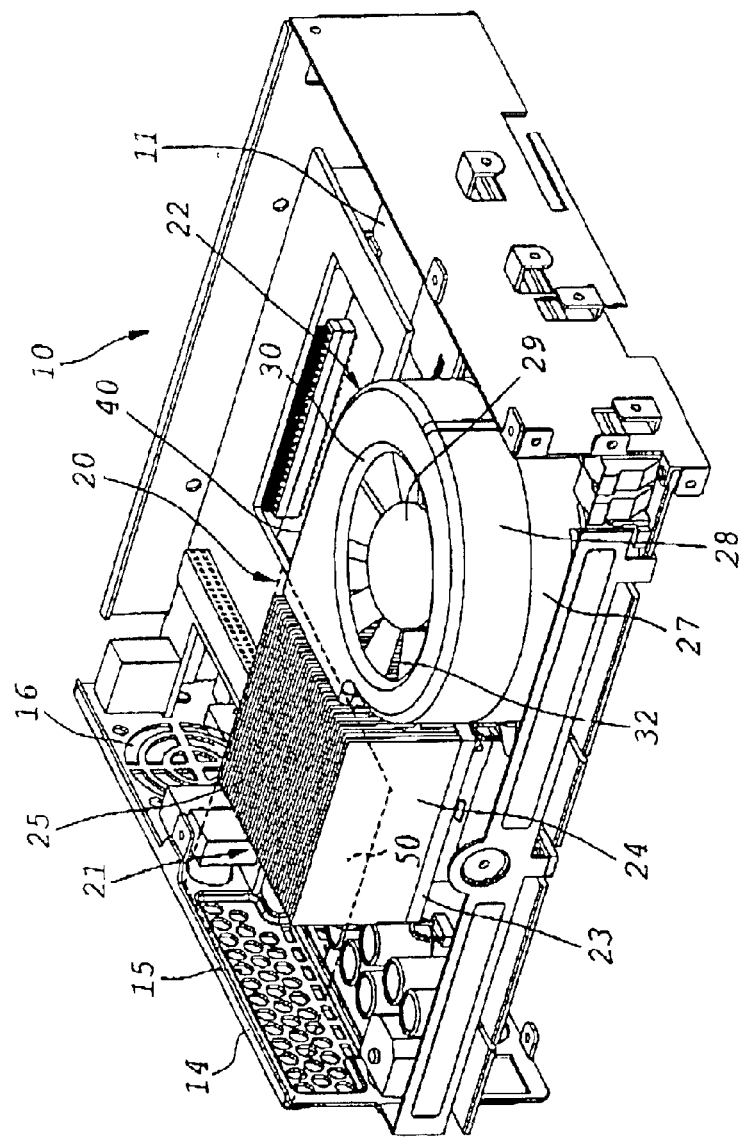
FIG. 4 shows a perspective assembly view of the present invention from another angle.
Figure 5:
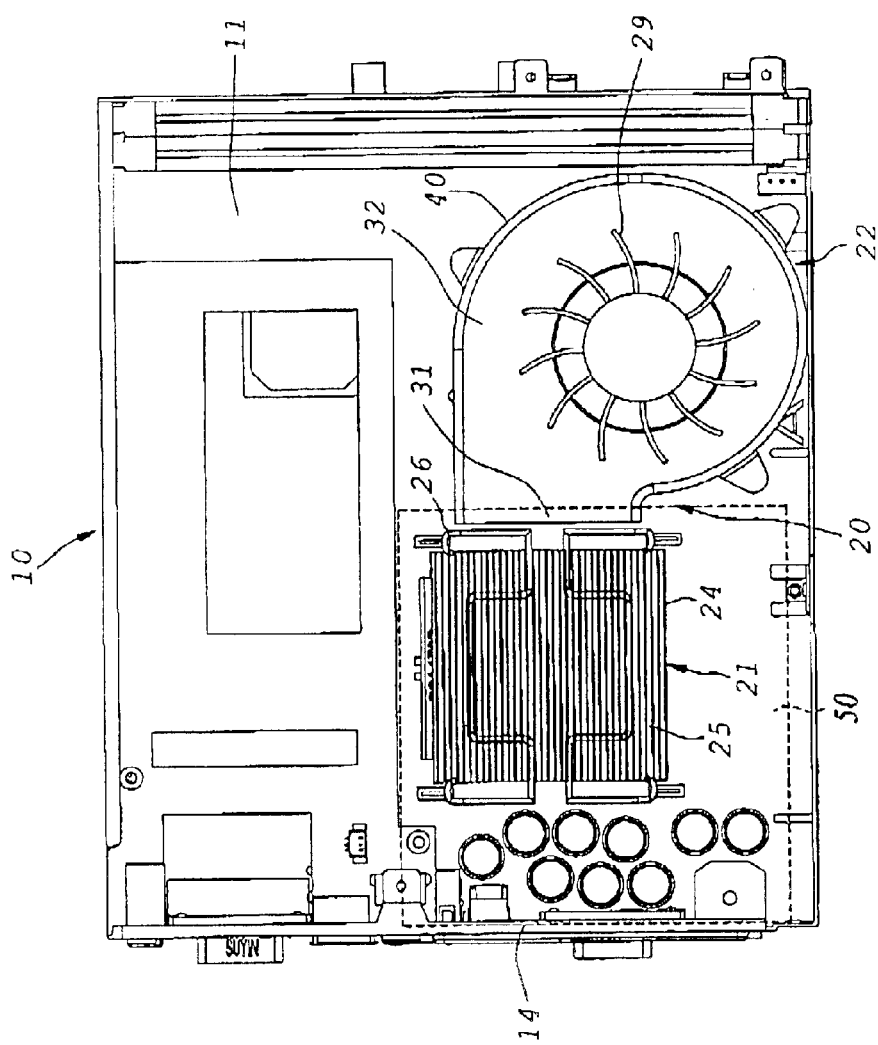
FIG. 5 shows a top plan view of the present invention.
Figure 6A:
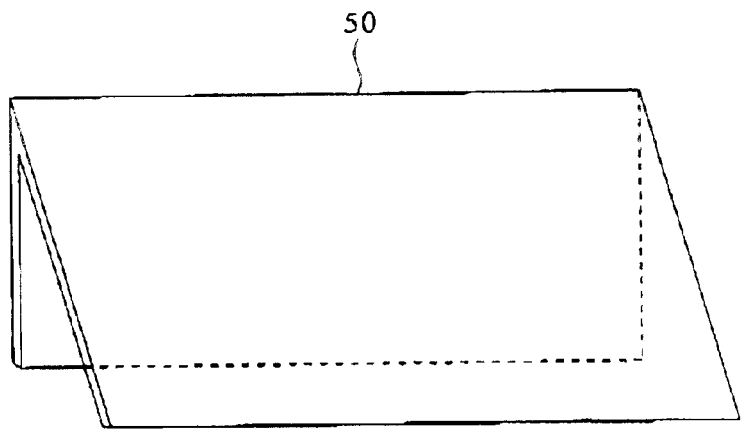
FIG. 6 shows an air-channeling device of the present Invention.
Figure 6B:
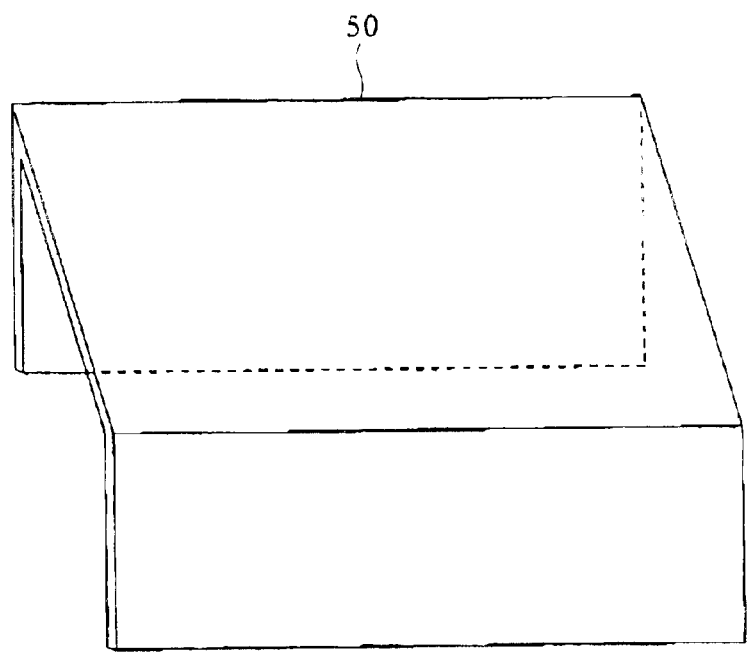

Please refer to FIGS. 2, 3, 4, 5 and 6. The present invention provides with a computer heat-dissipating assembly structure, more particularly, a computer heat-dissipating apparatus 20 mounted on a motherboard 11 within a computer host 10 for assisting two heat sources 12 and 13 in dissipating heat generated therefrom, wherein the primary heat source 12 is that like a CPU, whereas the secondary heat source 13 is that like a north bridge chipset which generates lower temperature than that of the primary heat source 12.

The computer heat-dissipating apparatus 20 comprises a heat-dissipating device 21 and an air-blowing device 22, wherein the heat-dissipating device 21 can be any type of aluminum extrusion, die casting and folding without limitation. The heat-dissipating device 21, made of effective heat-conducting material such as copper or aluminum, comprises a main body 23 having a plurality of fins 24 jointed thereon, with fin grooves 25 formed between the fins 24 so as to expedite the flow of air. The bottom surface of the main body 23 of the heat-dissipating device 21 is attached to the surface of the primary heat source 12, and a proper fastening means 26 can be mounted for fastening the heat-dissipating device 21 stably on the surface of the primary heat source 12, so as to enable the heat-dissipating device 21 to assist the primary heat source 12 in dissipating heat.

The air-blowing device 22, disposed on the side of the heat-dissipating device 21, is in the identical direction or parallel to the fins 24. The air-blowing device 22 comprises a lower cover 27, an upper cover 28 and a fan-blade body 29, wherein the lower cover 27 is made of effective heat-conducting material such as copper or aluminum, and the upper cover 28 can be made of metal or plastic. The upper cover 28 is mounted on top of the lower cover 27 to be integrally jointed with one another by engagement or utilizing screws to fasten both together, thus forming a housing 40 for the air-blowing device 22. An air inlet 30 is mounted on the top of the housing 40 (namely the top of the upper cover 28), and a protruding air outlet 31 is disposed on one-side of the housing 40 (namely one side of both the upper cover 27 and the lower cover 28). A containing chamber 32, disposed within the housing 40, is to link with both the air inlet 30 and the air outlet 31. The bottom surface of the lower cover 27 of the air-blowing device 22 is attached to the surface of the secondary heat source 13, and the lower cover 27 of the air-blowing device 22 is adequately fastened to the motherboard 11, so as to cause the direction of the air outlet 32 to be identical or parallel to the heat-dissipating direction of the heat-dissipating device 21.

The fan-blade body 29 is pivotally disposed within the containing chamber 32 of the housing 40, and a motor is disposed between the fan-blade body 29 and the housing 40 (not shown in drawings), so as to cause the fan-blade body 29 to rotate, during which air is drawn in through the air inlet 30 and discharged through the air outlet 31, so as to enable the air-blowing device to become a slantly-blowing fan. An air-channeling device 50 covers the periphery of both the heat-dissipating device 21 and the air-blowing device 22 so as to enable airflow from the air-blowing device 22 to blow off and thus discharge heat energy accumulated by the heat-dissipating device 21 in the air-channeling direction of the air-channeling device 50, thus the heat-dissipating structure of the present invention is formed thereby.

The heat-dissipating assembly structure can be disposed within the computer host 10, and the heat-dissipating device 21 and the air-blowing device 22 is designed to be separate to each other, so as to enable the heat-dissipating device 21 and the air-blowing device 22 respectively attach to the primary heat source 12 and the secondary heat source 13. Heat energy generated by the secondary heat source 13 such as the north bridge chipset with lesser amount of heat generated can be transferred to the lower cover 27 of the air-blowing device 22, and with the rotation of the fan-blade body 29, cold air is to be introduced through the air inlet 30 on the top of the housing 40 of the air-blowing device 22, and warm air is to be discharged through the air outlet 31 on one side of the housing 40 of the air-blowing device 22, thus dissipating the heat generated by the secondary heat source 13.

Heat energy generated during operation of the primary heat source 12 such as CPU can be transferred to the heat-dissipating device 21, whereon a plurality of fins 24 are formed for increasing the heat-dissipating area so as to cope with the primary heat source 12 having higher rate of heat generation, thus the heat-dissipating efficiency can be improved. In addition, warm air discharged through the air outlet 31 on one side of the housing 40 can dissipate heat for the primary heat source 12 and the heat-dissipating device 21 which are both placed on the outside of the air outlet 31 having high temperature, and warm air discharged through the air outlet 31 of the housing 40 can flow through the fin groove 25, and then hot air is to be discharged out through the air-discharging outlet 15 previously mounted on the side surface of the case 14 of the computer host 10. The shape of the air-discharging outlet 15 is not limited and can be varied according to different needs.

In addition, proper air inlet 16 can also be mounted on the case 14 of the computer host 10, so as to draw cold air into the computer host 10. The shape of the air inlet 16 is not limited and can be varied according to different needs. Another fan (not shown in drawings) can be mounted on the air inlet 16 so as to forcibly draw in cold air, thus achieving better air circulation effect.

The lower cover 27 of the air-blowing device 22 of the present invention provides with heat-conducting and heat-dissipating effect, and the air-blowing device is designed to slantly dissipate heat, thus wind pressure shall be less, and heat energy can be swiftly discharged, so as to acquire better heat-dissipating efficiency and greater heat-dissipating capacity can be achieved. Furthermore, the computer heat-dissipating structure of the present invention is designed to be separate, so as to dissipate heat generated from both heat sources 12 and 13 simultaneously, thus better heat-dissipating efficiency can be achieved. With such simple structural design of the present invention, the manufacturing cost shall not be increased and more space is not needed.

Moreover, the air-blowing device 22 of the present invention is disposed on the side of the heat-dissipating device 21, thus the overall height of the whole heat-dissipating apparatus 20 can be lowered, enabling the present invention to be applicable to computers having height limit.

In addition, the present invention actually discharges the high-temperature air generated by heat sources in a computer host such as CPU and the north bridge chipset slantly from the computer host, and with external cold air drawn by the air inlet 16 into the computer host 10, better air circulation can be achieved.

Furthermore, an air-channeling device 50 covers the periphery of both the heat-dissipating device 21 and the air-blowing device 22, enabling airflow generated by the air-blowing device 22 to dissipate heat energy accumulated in the heat-dissipating device 21 in the air-channeling direction of the air-channeling device 50, thus Improving upon the drawback of ineffective heat-dissipating condition within computer host and acquire better heat-dissipating efficiency.

Although the present invention has been described in considerable detail with reference to certain preferred embodiments thereof, those skilled in the art can easily understand that all kinds of alterations and changes can be made within the spirit and scope of the appended claims. Therefore, the spirit and scope of the appended claims should not be limited to the description of the preferred embodiments contained herein.

What is claimed is:

1. A method for computer host heat dissipation, a heat-dissipating device being mounted on a CPU utilized for partially or wholly conducting heat generated by said CPU to said heat-dissipating device, a fan being mounted on a north bridge chipset utilized for partially or wholly dissipating heat generated by said north bridge chipset, said fan having an air outlet utilized for blowing air flow towards said heat-dissipating device in an air-blowing direction, characterized in that a channeling device is disposed at the periphery of both said fan and said heat-dissipating device; said channeling device is utilized for directing an air-channeling direction, with such air-channeling direction being substantially parallel to the air-blowing direction by said fan, and said air-blowing direction by said fan is in said air-channeling direction, and said heat-dissipating device is in said air-blowing direction.

2. The method for computer host heat dissipation as in claim 1, wherein said heat-dissipating device is formed by parallel fins, and the fin grooves are disposed to be identical or parallel to the direction of both said air-blowing direction by said fan and said air-channeling direction.

3. The method for computer host heat dissipation as in claim 2, wherein a heat-conducting plate is further disposed between said fan and said north bridge chipset.

4. A The heat-dissipating apparatus comprising:

a heat-dissipating device having a plurality of parallel heat-dissipating fins utilized for direct or indirect contact with a primary heat source:

an air-blowing device utilized for blowing airflow out so as to assist in dissipating heat energy accumulated by said heat-dissipating fin, said air-blowing device contacting with a secondary heat source directly or indirectly; and an air-channeling device substantially covering the periphery of said heat-dissipating fins and said air-blowing device, said air-channeling device channeling air flow from said air-blowing device in the channeling direction of said air-channeling device, thus heat energy accumulated by said heat-dissipating fins is dissipated;

characterized in that said heat-dissipating fin and said air-blowing device are formed separately, fins of said heat-dissipating fin being substantially parallel, said air-blowing device having a single air outlet with an air-blowing direction thereof substantially identical or parallel to a direction formed by fin grooves between heat-dissipating fins of said heat-dissipating device.

5. A heat-dissipating apparatus comprising:

a heat-dissipating device having a plurality of parallel heat-dissipating fins utilized for direct or indirect contact with a primary heat source;

an air-blowing device including a fan and a heat-conducting device, utilized for blowing airflow out so as to assist in dissipating heat energy accumulated by said heat-dissipating fin, said air-blowing device contacting with a secondary heat source directly or indirectly; and an air-channeling device substantially covering the periphery of said heat-dissipating fins and said air-blowing device, said air-channeling device channeling air flow from said air-blowing device in the channeling direction of said air-channeling device, thus heat energy accumulated by said heat-dissipating fins is dissipated;

characterized in that said heat-dissipating fin and said air-blowing device are formed separately, fins of said heat-dissipating fin being substantially parallel, said air-blowing device having a single air outlet with an air-blowing direction thereof substantially identical or parallel to a direction formed by fin grooves between heat-dissipating fins of said heat-dissipating device.

6. A heat-dissipating apparatus comprising:

a heat-dissipating device having a plurality of parallel heat-dissipating fins utilized for directly contacting with a primary heat source:

an air-blowing device including a fan and a heat-conducting device, utilized for blowing airflow out so as to assist in dissipating heat energy accumulated by said heat-dissipating fin, said heat-conducting device directly contacting with a secondary heat source: and an air-channeling device substantially covering the periphery of said heat-dissipating fins and said air-blowing device, said air-channeling device channeling air flow from said air-blowing device in the channeling direction of said air-channeling device, thus heat energy accumulated by said heat-dissipating fins is dissipated;

characterized in that said heat-dissipating fin and said air-blowing device are formed separately, fins of said heat-dissipating fin being substantially parallel, said air-blowing device having a single air outlet with an air-blowing direction thereof substantially identical or parallel to a direction formed by fin grooves between heat-dissipating fins of said heat-dissipating device.

7. A heat-dissipating apparatus comprising:

a heat-dissipating device utilized for contacting a primary heat source directly or indirectly;

an air-blowing device utilized for contacting a secondary heat source directly or indirectly and assisting in dissipating heat energy accumulated by said heat-dissipating device; and an air-channeling device substantially covering the periphery of said heat-dissipating device and said air-blowing device, said air-channeling device directing air flow from said air-blowing device in an air-channeling direction of said air-channeling device, thus heat energy accumulated by said heat-dissipating device is dissipated;

characterized in that said air-blowing device has a single air outlet, said air-blowing device including a fan and a heat-conducting device, and said heat-conducting device having direct contact with said secondary heat source.

8. The heat-dissipating apparatus as in claim 7, wherein said air-channeling device is an-shaped or an L-shaped cover.

9. The heat-dissipating apparatus as in claim 8, wherein said heat-dissipating device is formed by parallel heat-dissipating fins, and the direction of the fin grooves between parallel fins, the air-blowing direction by said air-blowing device and the air-channeling direction of said air-channeling device are substantially identical or parallel.

* * * * *